(12) United States Patent
Khoury et al.

(10) Patent No.: US 7,724,087 B2
(45) Date of Patent: May 25, 2010

(54) HIGH SPEED DIFFERENTIAL RECEIVER WITH RAIL TO RAIL COMMON MODE OPERATION HAVING A SYMMETRICAL DIFFERENTIAL OUTPUT SIGNAL WITH LOW SKEW

(75) Inventors: Elie G. Khoury, Gilbert, AZ (US); D.C. Sessions, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 173 days.

(21) Appl. No.: 11/587,103

(22) PCT Filed: Apr. 19, 2005

(86) PCT No.: PCT/IB2005/051278

§ 371 (c)(1),
(2), (4) Date: Apr. 25, 2008

(87) PCT Pub. No.: WO2005/104356

PCT Pub. Date: Nov. 3, 2005

(65) Prior Publication Data

US 2008/0258812 A1 Oct. 23, 2008

(51) Int. Cl.
*H03F 3/26* (2006.01)
(52) U.S. Cl. .................. 330/253; 330/258; 330/308
(58) Field of Classification Search .................. 330/253, 330/258, 260, 261; 326/115, 127, 121
See application file for complete search history.

(56) References Cited

U.S. PATENT DOCUMENTS

| | | | |
|---|---|---|---|
| 5,734,294 A * | 3/1998 | Bezzam et al. ............... 327/552 |
| 5,801,564 A | 9/1998 | Gasparik | |
| 5,936,469 A * | 8/1999 | Alexander et al. ........... 330/258 |
| 5,986,511 A * | 11/1999 | Castellucci .................. 330/308 |
| 6,084,478 A * | 7/2000 | Mayampurath ............. 330/308 |
| 6,204,980 B1 * | 3/2001 | Momtaz et al. ................ 360/29 |
| 6,535,062 B1 | 3/2003 | Linder et al. | |
| 6,784,750 B2 * | 8/2004 | Chiou et al. ................. 330/308 |
| 7,400,173 B1 * | 7/2008 | Kwong et al. .................. 326/86 |
| 2003/0094977 A1 | 5/2003 | Li et al. | |

FOREIGN PATENT DOCUMENTS

| | | |
|---|---|---|
| EP | 0 349 205 | 1/1990 |
| EP | 1 248 371 | 10/2002 |

OTHER PUBLICATIONS

Peeters E et al: "A Fully Differential 1.5V Low-Power CMOS Operational Amplifier With Rail-to-Rail Current-Regulated Constant-GM Input Stage"; Proceedings of the IEEE 1997 Custom Integrated Circuits Symposium; Santa Clara May 5-8, 1997; vol. 8 pp. 75-78.

* cited by examiner

*Primary Examiner*—Vibol Tan

(57) ABSTRACT

A novel high-speed differential receiver is disclosed that provides a new method and apparatus receiving and amplifying a small differential voltage with a rail-to-rail common mode voltage. The receiver output signals are differential signals with low skew and high symmetry. This high-speed differential receiver is based on a common mode voltage normalization, which is based on a differential phase splitting methodology, before the resulting signal is recombined, normalized and amplified. The method involves using a differential signal splitting followed by a common mode voltage normalization stage, then a controlled gain transimpedance amplification, and then amplification using one or two rail to rail amplification stages that are symmetrical and balanced in nature.

18 Claims, 4 Drawing Sheets

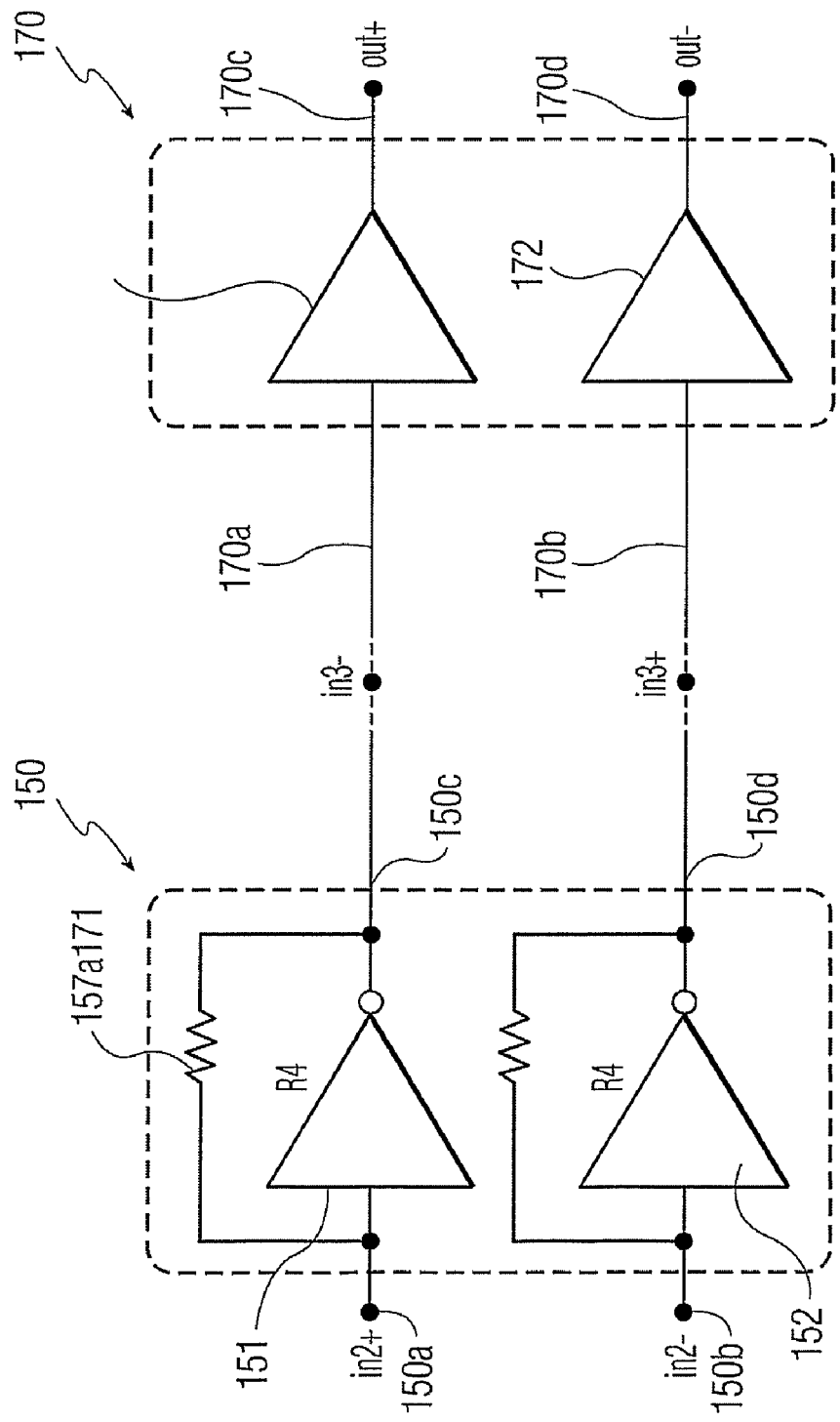

HIGH SPEED DIFFERENTIAL RECEIVER WITH RAIL TO RAIL COMMON MODE OPERATION HAVING A SYMMETRICAL DIFFERENTIAL OUTPUT SIGNAL WITH LOW SKEW

The invention relates to the field of differential receiver circuits and more specifically to the field of differential receiver circuits with rail-to-rail common mode operation with differential output signal low skew and symmetry.

One conventional technique used for receiving of low swing differential signals, having a rail to rail common mode voltage (CMV) range, is to utilize two receiver circuits. The first receiver circuit is, for example, a NMOS type input transistor, which is used to receive a signal with a CMV close to a supply voltage potential (Vdd) and a PMOS type input transistor for receiving a signal with a CMV close to ground potential, gnd. Output signals from the two receiver circuits are then combined into a single ended output signal from an output port thereof. The differential receiver circuits are typically of any form of differential amplifier, however, the most common differential amplifiers are typically highly accurate folded cascode ones.

U.S. Pat. No. 5,801,564 discloses a reduced skew differential receiver that utilizes first and second differential amplifiers. Unfortunately, careful coupling of the two differential amplifiers is required in order to attain predetermined operation. Additionally, this circuit is quite complex and as a result affects the creation of low skew and symmetry in the differential output signal.

A need therefore exists to provide a high-speed performance differential receiver with low skew and a symmetrical differential output signal at a low design cost. It is therefore an object of the invention to provide a differential receiver circuit with rail-to-rail common mode operation while providing differential output signal low skew and symmetry.

In accordance with the invention there is provided a differential receiver circuit comprising: a first supply voltage port as a first rail for receiving of a first potential; and a second supply voltage port as a second rail for receiving of a second potential that is lower than the first potential, a differential signal splitter comprising a first branch and a second branch disposed between the first and second supply voltage ports and first and second input ports for receiving of a differential input signal and first through fourth output ports for providing of two complementary differential output signals therefrom; a common mode voltage (CMV) normalization stage for level shifting the two complementary differential output signals to form one complementary differential output signal, the CMV normalization stage comprising first through fourth input ports electrically coupled with the first through fourth output ports of the differential signal splitter stage and first and second output ports; a transimpedance amplifier comprising first and second input ports electrically coupled with the first and second output ports of the CMV normalization stage and first and second output ports for providing a rail to rail complementary differential output signal having low signal skew and symmetry, wherein the differential signal splitter, the common mode voltage (CMV) normalization stage and the amplifier are disposed between the first and second supply voltage port for receiving of the first and second potentials therefrom.

In accordance with the invention there is provided a method of providing a differential output signal comprising: providing a first voltage as a first rail and a second other voltage as a second other rail; receiving of a differential input signal having a common mode voltage (CMV) and being other than rail to rail from the second voltage to the first voltage; phase splitting the differential input signal into two complementary differential output signals having a crossover voltage and that other than overlap being spaced one from the other in potential; level shifting the two complementary differential output signals and summing of analogous signals within each the complimentary differential signals to form one complementary output signal that is other than rail to rail; and, amplifying the one complementary output signal to form a rail to rail complimentary differential signal having similar temporal characteristics to the level shifted signals and a transition approximately from rail to rail between the first and second voltages.

In accordance with the invention there is provided a circuit comprising: means for providing a first voltage as a first rail and a second other voltage as a second other rail; means for receiving of a differential input signal having a common mode voltage (CMV) and being other than rail to rail from the second voltage to the first voltage; means for phase splitting the differential input signal into two complementary differential output signals having a crossover voltage and that other than overlap being spaced one from the other in potential; means for level shifting the two complementary differential output signals and summing of analogous signals within each the complimentary differential signals to form one complementary output signal that is other than rail to rail; and, means for amplifying the one complementary output signal to form a rail to rail complimentary differential signal having similar temporal characteristics to the level shifted signals and a transition approximately from rail to rail between the first and second voltages.

In accordance with the invention there is provided a storage medium for storing of instruction data comprising: first instruction data for providing a first voltage as a first rail and a second other voltage as a second other rail; second instruction data for receiving of a differential input signal having a common mode voltage (CMV) and being other than rail to rail from the second voltage to the first voltage; third instruction data for phase splitting the differential input signal into two complementary differential output signals having a crossover voltage and that other than overlap being spaced one from the other in potential; fourth instruction data for level shifting the two complementary differential output signals and summing of analogous signals within each the complimentary differential signals to form one complementary output signal that is other than rail to rail; and, fifth instruction data for amplifying the one complementary output signal to form a rail to rail complimentary differential signal having similar temporal characteristics to the level shifted signals and a transition approximately from rail to rail between the first and second voltages.

Exemplary embodiments of the invention will now be described in conjunction with the following drawings, in which.

Figure 2A:
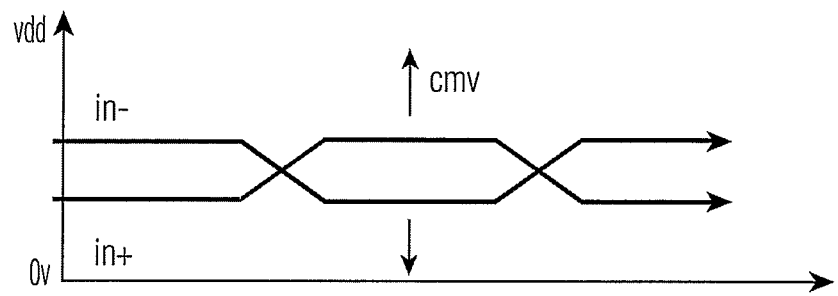
Figure 2B:
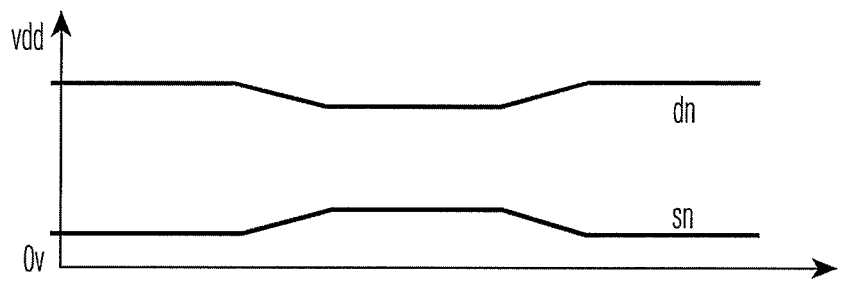
Figure 2C:
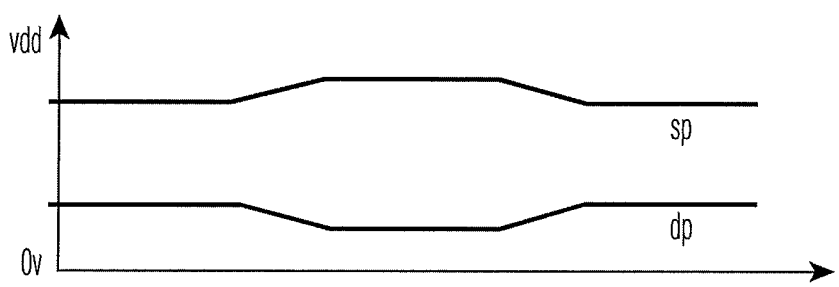
Figure 3A:
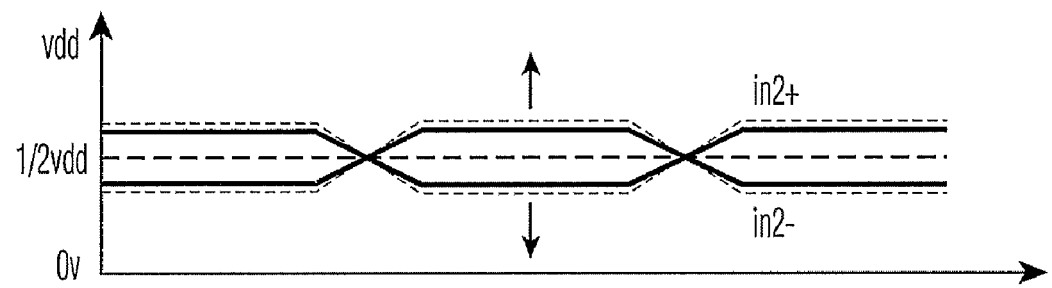
Figure 3B:
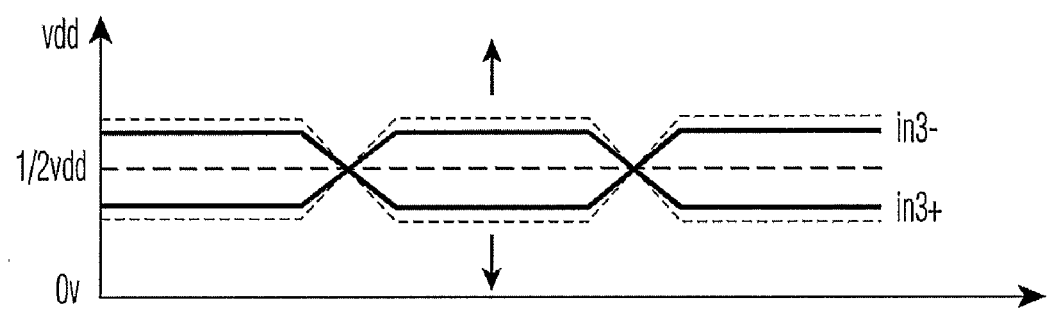
Figure 3C:
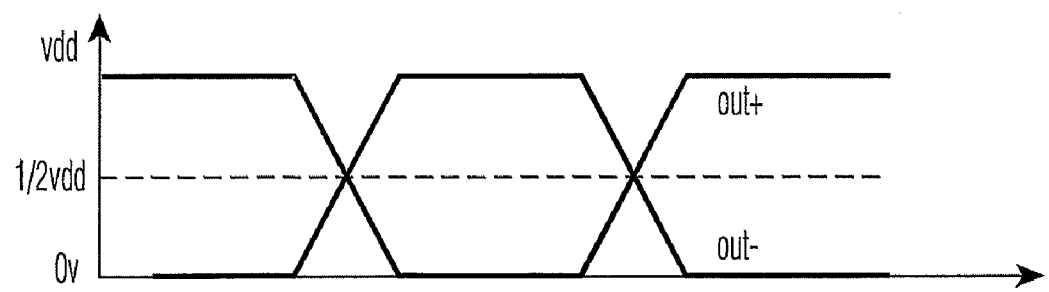

FIG. 1c a transimpedance amplifier stage, which is a third stage of the rail-to-rail CMV differential receiver circuit;

FIG. 1d illustrates a buffer stage, which is a rail-to-rail output driver stage, which is a fourth stage of the rail-to-rail CMV differential receiver circuit;

FIG. 2a graphically depicts small differential signal input signal, "in+" and "in−", which is provided to differential input ports of the rail-to-rail CMV differential receiver circuit;

FIG. 2b illustrates an increase in the "dn" voltage and decrease the "sn" voltage as a result of the "in+" voltage rising;

FIG. 2c illustrates a decrease in the "sp" voltage and an increase in the "dp" voltage as a result of the "in+" voltage rising;

FIG. 3a illustrates output signals, "in2−" and "in2+", provided from output ports of the second stage;

FIG. 3b illustrates output signals, "in3−" and "in3+", provided from output ports of the third stage; and, FIG. 3c illustrates output signals, "out−" and "out+", provided from output ports of the rail-to-rail CMV differential receiver circuit.

Figure 1A:
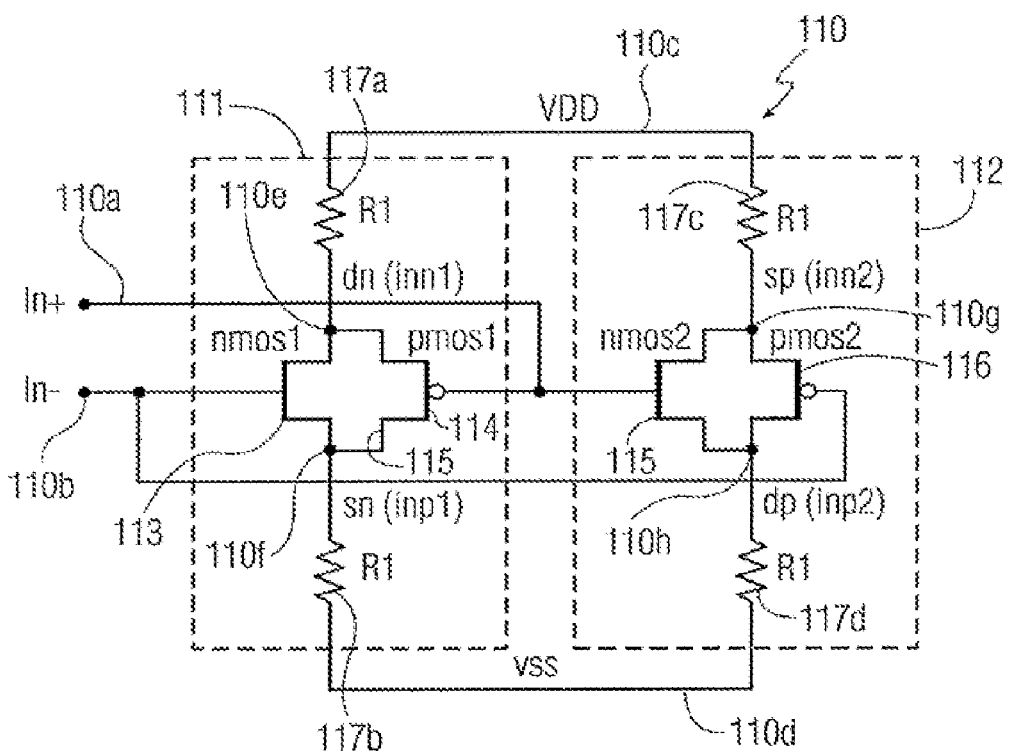
FIG. 1a illustrates a differential signal splitter input stage, which is the first stage of a rail-to-rail common mode voltage (CMV) differential receiver circuit.
Figure 1B:
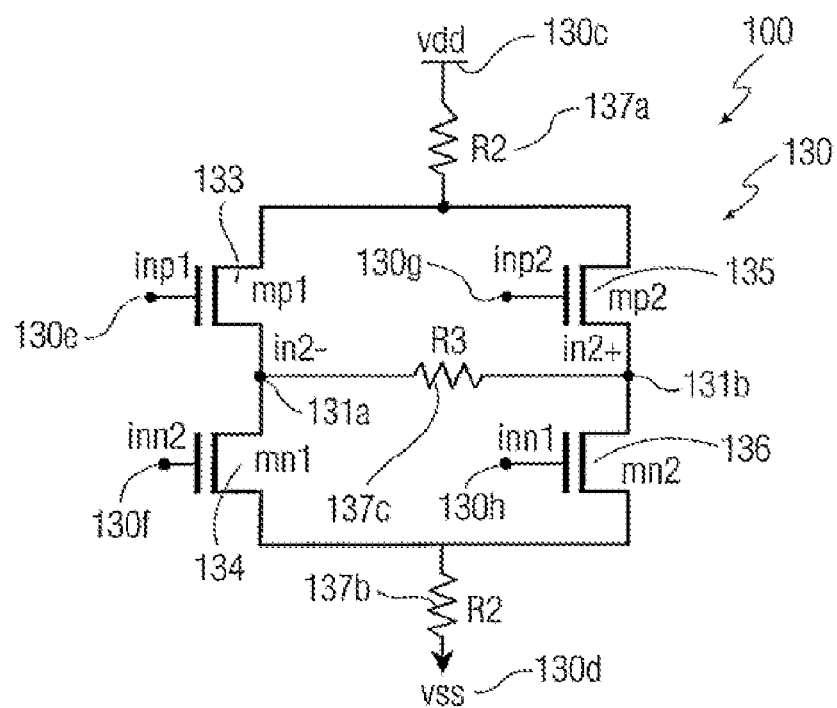
FIG. 1b illustrates a CMV normalization stage, which is a second stage of the rail-to-rail CMV differential receiver circuit.

FIGS. 1a through 1d illustrate multiple stages of a rail-to-rail common mode voltage (CMV) differential receiver circuit 100 in accordance with the preferred embodiment of the invention. The differential receiver circuit 100 is comprised of four stages of symmetrical circuits that are disposed in series. FIG. 1a illustrates a differential signal splitter input stage 110, which is the first stage. FIG. 1b illustrates the second stage, the CMV normalization stage 130. FIG. 1c illustrates the third stage, a transimpedance amplifier stage 150. FIG. 1d illustrates the fourth stage, a buffer stage, which is a rail-to-rail output driver stage 150.

Referring to FIG. 1a, the first stage 110 is comprised of two symmetrical circuit branches, a first branch 111 and a second branch 112. Disposed within the first branch 111 are a first n channel metal oxide semiconductor (NMOS) transistor (NMOS1) 113 and a first p channel metal oxide semiconductor (PMOS) transistor (PMOS1) 114. Disposed within the second branch 112 are a second NMOS transistor (NMOS2) 115 and a second PMOS transistor (PMOS2) 116. Four resistive loads, labeled R1, 117a through 117d, electrically couple the drain and source terminals of devices NMOS1 113, PMOS1 114 and NMOS2 115, PMOS2 116 to a first and second supply voltage ports, 110c and 110d, connected for receiving of potential voltages, Vdd and Vss, respectively.

The gate terminals of transistors PMOS1 114 and NMOS2 115 are electrically coupled together and are electrically coupled with a first input port 110a, which his labeled "In+." Gate terminals of transistors PMOS2 116 and NMOS1 113 are electrically coupled together to a second input port 110b, which is labeled "In−." The first and second input ports, 110a and 110b, form the differential input ports to the first stage 110. The first stage 110 additionally has four output ports, 110e through 110h, which are labeled: inn1, inp1, inn2, inp2, for providing of respective signals dn, sn, sp, dp, therefrom.

In use, the first 110 stage functions as a differential signal phase splitting stage. The input signal provided to the differential input ports, 110 and 110b, of this stage is a small differential signal with a potential of approximately 50 mv to 400 mv having a rail-to-rail common mode voltage (CMV).

The first branch 111 is comprised of the NMOS1 and PMOS1 devices, 113 and 114, which are electrically coupled together in a pass-gate configuration. Each side of this pass-gate is electrically coupled to a respective resistor, where resistors 117a and 117b respectively electrically couple the drain and source terminals of NMOS1 and PMOS1 devices, 113 and 114, to the 110c and 110d supply voltage ports. Resistors 117c and 117d are used for respective coupling of the drain and source terminals of NMOS2 and PMOS2 devices, 115 and 116, to the 110c and 110d supply voltage ports.

Referring to FIG. 2a, this figure graphically depicts what occurs when a small differential signal, "in+" and "in−," is applied to the input ports, 110 and 110b, which are the gate terminals of the MOS devices 113 and 114. As the "in+" voltage rises the PMOS1 device 114 conduct less current and the same, but opposite, occurs for the NMOS1 device 113. For the input port 110b, as the potential of the signal "In−" falls the NMOS1 device 113 conduct less current. The total effect is to increase pass-gate impedance and therefore a decrease in the current that propagates through this first branch 111. As is shown in FIG. 2b, for output ports 110e and 110f, an increase in the "dn" voltage and decrease in the "sn" voltage is observed as a result of the "in+" voltage rising.

Figure 2D:
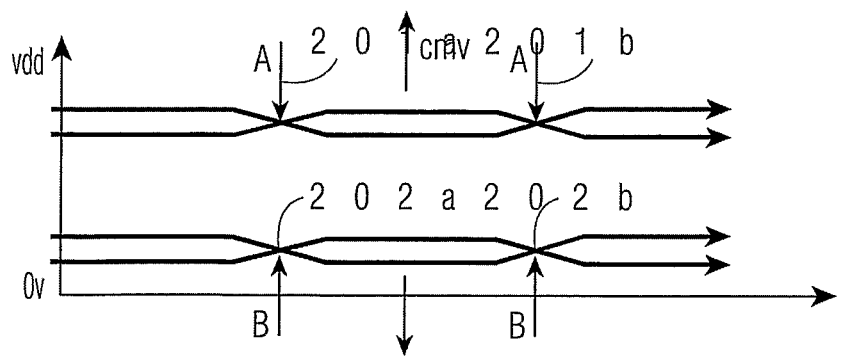

A similar type of event is observed in the second branch 112, but with opposite effects to that of the first branch 111. Referring to FIG. 2c, this transition of the "in+" voltage rising results in a decrease in the "sp" voltage and an increase in the "dp" voltage, as observed on the 110g and 110h output ports. FIG. 2d illustrates four superimposed output signals, dn, sn, sp and dp, provided from respective output ports 110e through 110h for this first stage 110. This figure also illustrates that starting with one differential signal, results in the generation of two complementary differential signals with a very small skew of approximately a few Pico seconds between the upper and lower sets of crossover points, labeled "A", 201a and 201b, and "B", 202a and 202b. Furthermore, as the input CMV change, the corresponding crossover voltage moves up or down in potential but remains relatively constant in time or in a timing relationship. Also, as the differential amplitude changes so does the differential amplitude of both complementary differential output signals.

Referring back to FIG. 1a, as the input CMV moves toward higher Vdd potentials, the pass-gate structure conducts current even when the PMOS1 device 114 is either turned off or close to being turned off. As the input CMV moves toward ground, the pass-gate structure conducts current even when the NMOS1 device 113 is either turned off or is close to being turned off.

So in extreme cases for the CMV, either towards higher Vdd or lower Vss, the differential phase splitting is performed by one of the MOS devices, which is either the NMOS1 device 113 or the PMOS1 device 114, respectively. In the case of extreme CMV, when the first branch 111 is conducting more current than the second branch 112, the differential phase splitting works with a rail to rail CMV.

Optionally, the differential gain of this first stage is less than unity, where it is optionally 50% of the differential input voltage. Preferably, during integrated manufacturing, the dimensions of each of the PMOS and NMOS devices, 113 through 116, as well as the resistors, 117a through 117d, are chosen in order to approximately optimize for best performance of cross-over voltage and differential phase splitting.

Referring back to FIG. 1b, the CMV normalization stage is shown with two NMOS devices, labeled MN1 134 and MN2 136, and two PMOS devices, labeled MP1 133 and MP2 135. Drain terminals of devices MP1 133 and MP2 135 are electrically coupled together and are further electrically coupled to a first supply voltage port 130c, for receiving of Vdd, through resistor R2 137a. Source terminals of devices MN1 134 and MN2 136 are electrically coupled together and are further electrically coupled to a second supply voltage port 130d, for receiving of Vss, through resistor R2 137b. A third resistor R3 137c is disposed between a junction formed between the source terminal of device MP1 133 and the drain terminal of device MN1 134 and a junction formed between the source terminal of device MP2 135 and the drain terminal of device MN2 136.

Gate terminals of the PMOS devices, MP1 133 and MP2 135, form input ports 130e and 130f to the second stage 130 and are electrically coupled with output ports 110f and 110h, respectively, of the first stage bottom side. Gate terminals of the NMOS devices, MN1 134 and MN2 136, are electrically coupled to the output ports, 110e and 110g, of the first stage top side. This second stage is a complementary differential stage, which is used to normalize the common mode voltage (CMV) to approximately Vdd/2.

Referring to FIG. 3a, when the input voltage "inp1," provided to input port 130e, is lower than the input voltage "inp2," provided to input port 130g, and when the input voltage "inn2," provided to input port 130f, is higher than "inn1," provided to input port 130h, a positive current path flows through resistor R3 137c from node 131a, as is indicated by signal "in2−", toward node 131b, as is indicated by signal "in2+". A main current path is formed from the first supply voltage port 130c, resistor R2 137a through transistor MP1 133, through resistor R3 137c, through transistor MN2 136, through resistor R2 137b and finally into the second supply voltage port 130d, which is ground, Vss.

When the input conditions are reversed, the reverse is true. A positive current propagates through resistor R3 from node 131b, "in2+", to node 131a, "in2−". Preferably, the PMOS and NMOS devices, 133, 135, 134, 136 are designed to have equal active areas and comparable gain, gm. This equalizes capacitive loading of the first stage 110 and aids in skew and symmetry of the output signals provided from output ports, 131a and 131b of this second stage 130. With an equal gain, gm, for the transistors MP1 133, MP2 135 and MN1 134, MN2 136, positive and negative currents flowing in resistor R3 137c are equal. Therefore, the output differential voltage provided from the output ports, 131a and 131b, of the second stage 130 is centered about a CMV of Vdd/2. Furthermore, because the second stage 130 is primarily used to normalize the CMV, the voltage gain of this stage is not essential. Voltage gain is performed in the third stage 150.

Furthermore, for FIG. 3a, as the differential input CMV changes for the first stage 110, the four output signals provided from the output ports, 110e through 110h, shift up and down in potential. Referring to FIG. 3b, as the second stage 130 differential output signal, provided from output ports 131a and 131b, changes in differential amplitude, its CMV stays constant—around Vdd/2.

Referring back to FIGS. 1c and 1d, these figures illustrate the transimpedance stages. Output ports of the second stage, 131a and 131b, are electrically coupled with input ports 150a and 150b, with signals "in2+" and "in2−" being provided from these ports, of the third stage 150. The transimpedance stage 150 includes two inverters, a first inverter 151 and a second inverter 152, with a respective feedback load resistor, 157a and 157b. Each resistor R4, 157a and 157b, provides a negative feedback to the inverter's input port, 150a or 150b, from its output port, therefore lowering a normally high gain of each inverter from few hundred, or thousands, to a small value such as five. The net effect of this transimpedance stage 150 is that it creates an output waveform with equal rise and fall times given that the differential input signal provided to the input ports 150a and 150b is within specification. This third stage 150 forms a resistive load to the second stage 130, since by definition, the input signal provided to the transimpedance stage input ports, 150a and 150b, is in the form of a current.

Referring to FIG. 3b, output signals, "in3+" and "in3−", provided from output ports, 150c and 150d, of the transimpedance stage 150 are not rail to rail since a crowbar, or through current is involved. Effectively, the transimpedance stage 150 loads the second stage 130 with extra current and provides additional CMV equalization for the second stage 130. Additionally, since the output signals of the transimpedance stage 150 are controlled by design of the circuitry, signals "in3+" and "in3−," provided from output ports 150c and 150d, are symmetrical differential signals with very low skew and are centered around Vdd/2, but are not rail-to-rail. Referring to FIG. 3c, as the first stage 110 differential input CMV change, the third stage 150 differential output signal changes in differential amplitude, but it's CMV stays constant around Vdd/2.

Referring to FIG. 1d, the fourth stage is provided with two input ports 170a and 170b electrically coupled with the output ports 150c and 150c of the third stage 150. This fourth stage 170 receives the output signals from the third stage 150 and buffers them using buffer circuits 171 and 172 in order to form output signals, "out+" and "out−", on output ports 170c and 170d. Referring to FIG. 3d, the resulting output signals, "out+" and "out−", are rail to rail. By design, this fourth stage 170 is optimized to amplify and buffer the third stage 150 output signals and to preserve the low skew and rise and fall symmetry of the waveforms and the CMV.

Advantageously, the differential receiver in accordance with the embodiment of the invention is useable with high speed, or optionally low speed, differential signal amplification and signal communication where low skew and high symmetry are preferred.

Numerous other embodiments may be envisaged without departing from the spirit or scope of the invention.

What is claimed is:

1. A differential receiver circuit comprising:

a first supply voltage port as a first rail for receiving of a first potential;

a second supply voltage port as a second rail for receiving of a second potential that is lower than the first potential;

a differential signal splitter including a first branch and a second branch disposed between the first supply voltage port and the second supply voltage port, the differential signal splitter further including a first input port and a second input port for receiving of a differential input signal and first through fourth output ports for providing of two complementary differential output signals;

a common mode voltage normalization stage for level shifting the two complementary differential output signals to form one complementary differential output signal, the common mode voltage normalization stage including first through fourth input ports electrically coupled with the first through fourth output ports of the differential signal splitter stage, and further including first and second output ports of the common mode voltage normalization stage;

a transimpedance amplifier including first and second input ports of the transimpedance amplifier electrically coupled with the first and second output ports of the common mode voltage normalization stage, and further including first and second output ports of the transimpedance amplifier for providing a rail to rail complementary differential output signal having low signal skew and symmetry;

wherein the differential signal splitter the common mode voltage normalization stage and the transimpedance amplifier are disposed between the first supply voltage port and the second supply voltage port for receiving of the first potential and the second potential;

wherein the first branch comprises: a first PMOS device having gate, drain and source terminals; a first NMOS device having a gate terminal and drain and source terminals electrically coupled with the drain and source terminals of the first PMOS device;

wherein the second branch comprises: a second PMOS device having gate, drain and source terminals; a second NMOS device having a gate terminal and drain and source terminals electrically coupled with the drain and source terminals of the second PMOS device where the gate terminals of the first PMOS device and the second NMOS device are electrically coupled together and form the first input port of the differential signal splitter stage and the gate terminals of the second PMOS device and the first NMOS device form the second input port of the differential signal splitter stage.

2. A differential receiver circuit according to claim 1 comprising a buffer stage comprising a first input port and a second input port electrically coupled with the first output port and the second output port of the transimpedance amplifier and a first output port and a second output port for providing the rail to rail complementary differential output signal.

3. A differential receiver circuit according to claim 1 wherein the NMOS devices and PMOS devices comprise approximately equal active areas and approximately equal gains.

4. A differential receiver circuit according to claim 1 comprising: wherein the first branch comprises a first set of two approximately identical resistors respectively disposed between the drain terminals of the electrically coupled first NMOS device and first PMOS device and the first supply voltage port and between the source terminals of the electrically coupled first NMOS device and first PMOS device and the second supply voltage port wherein the first output port and the second output port of the differential signal splitter stage are formed respectively at the electrically coupled drain and source terminals of the first NMOS device and the first PMOS device.

5. A differential receiver circuit according to claim 4 wherein the second branch comprises a second set of two approximately identical resistors which are approximately identical to the first set of resistors respectively disposed between the drain terminals of the electrically coupled second NMOS device and second PMOS device and the first supply voltage port and between the source terminals of the electrically coupled second NMOS device and second PMOS device and the second supply voltage port wherein the third output port and the fourth output port of the differential signal splitter stage are formed respectively at the electrically coupled drain and source terminals of the second NMOS device and second PMOS device.

6. A differential receiver circuit according to claim 1 wherein the common mode voltage normalization stage comprises:
a first branch;
a second branch; and,
a first resistive coupling between a first end of both branches to the first supply voltage port and a second resistive coupling between a second end of both branches to the second supply voltage port wherein resistance values for the first resistive coupling and second resistive coupling are approximately equal.

7. A differential receiver circuit according to claim 6 wherein the first branch of the common mode voltage normalization stage comprises: a first PMOS device having a gate terminal electrically coupled with the first input port of the common mode voltage normalization stage a drain terminal electrically coupled to the first end of the first branch and a source terminal; and, a first NMOS device having a gate terminal electrically coupled with the second input port of the common mode voltage normalization stage a drain terminal electrically coupled to the source terminal of the first PMOS device for forming the first output port of the common mode voltage normalization stage, and the source terminal thereof electrically coupled to the second end of the first branch.

8. A differential receiver circuit according to claim 7 wherein the second branch of the common mode voltage normalization stage comprises:
a second PMOS device having a gate terminal electrically coupled with the third input port of the common mode voltage normalization stage a drain terminal electrically coupled to the first end of the second branch and a source terminal; and,
a second NMOS device having a gate terminal electrically coupled with the fourth input port of the common mode voltage normalization stage a drain terminal electrically coupled to the source terminal of the second PMOS device for forming the second output port of the common mode voltage normalization stage, and the source terminal thereof electrically coupled to the second end of the second branch.

9. A differential receiver circuit according to claim 8 wherein the NMOS devices and PMOS devices comprise approximately equal active areas and approximately equal gains.

10. A differential receiver circuit according to claim 1 comprising a third resistor disposed between the first output port and the second output port of the common mode voltage normalization stage.

11. A differential receiver circuit according to claim 1 wherein the transimpedance amplifier comprises: a first inverter circuit disposed between the first input port and the first output port of the transimpedance amplification stage and, a fourth resistor disposed in parallel with the first inverter circuit.

12. A differential receiver circuit according to claim 11 wherein the transimpedance amplifier comprises: a second inverter circuit disposed between the second input port and the second output port of the transimpedance amplification stage and, a fourth resistor disposed in parallel with the second inverter circuit.

13. A differential receiver circuit according to claim 2 wherein the buffer stage comprises a first buffer circuit disposed between the first input port and the first output port of the buffer stage.

14. A differential receiver circuit according to claim 13 wherein the buffer stage comprises a second buffer circuit disposed between the second input port and the second output port of the buffer stage.

15. A differential receiver circuit according to claim 1 wherein the differential input signal has a potential of approximately 50 mv to 400 mv and has a rail-to-rail common mode voltage.

16. A differential receiver circuit according to claim 2 comprising a same integrated circuit semiconductor substrate, wherein the differential signal splitter, the common mode voltage normalization stage, the transimpedance amplifier circuit, and the buffer stage are integrated within the same integrated circuit semiconductor substrate.

17. A differential receiver circuit comprising:
a first supply voltage port as a first rail for receiving of a first potential;
a second supply voltage port as a second rail for receiving of a second potential that is lower than the first potential;
a differential signal splitter including a first branch and a second branch disposed between the first supply voltage port and the second supply voltage port, the differential signal splitter further including a first input port and a second input port for receiving of a differential input signal and first through fourth output ports for providing of two complementary differential output signals;

a common mode voltage normalization stage for level shifting the two complementary differential output signals to form one complementary differential output signal, the common mode voltage normalization stage including first through fourth input ports electrically coupled with the first through fourth output ports of the differential signal splitter stage, and further including first and second output ports of the common mode voltage normalization stage;

a transimpedance amplifier including first and second input ports of the transimpedance amplifier electrically coupled with the first and second output ports of the common mode voltage normalization stage, and further including first and second output ports of the transimpedance amplifier for providing a rail to rail complementary differential output signal having low signal skew and symmetry;

wherein the differential signal splitter the common mode voltage normalization stage and the transimpedance amplifier are disposed between the first supply voltage port and the second supply voltage port for receiving of the first potential and the second potential;

wherein the transimpedance amplifier comprises: a first inverter circuit disposed between the first input port and the first output port of the transimpedance amplification stage and, a fourth resistor disposed in parallel with the first inverter circuit.

18. A differential receiver circuit according to claim 17 wherein the transimpedance amplifier comprises: a second inverter circuit disposed between the second input port and the second output port of the transimpedance amplification stage and, a fourth resistor disposed in parallel with the second inverter circuit.

* * * * *